United States Patent
Cohen et al.

(10) Patent No.: US 12,129,165 B1
(45) Date of Patent: Oct. 29, 2024

(54) APPARATUS AND METHOD FOR FUEL DISPENSING NOZZLE MAINTENANCE OR VEHICLE BATTERY RECHARGING NOZZLE MAINTENANCE

(71) Applicant: Air Products and Chemicals, Inc., Allentown, PA (US)

(72) Inventors: Joseph P. Cohen, Bethlehem, PA (US); Jillian N. Wilms, Long Beach, CA (US)

(73) Assignee: Air Products and Chemicals, Inc., Allentown, PA (US)

( * ) Notice: Subject to any disclaimer, the term of this patent is extended or adjusted under 35 U.S.C. 154(b) by 30 days.

(21) Appl. No.: 18/139,539

(22) Filed: Apr. 26, 2023

(51) Int. Cl.
*B67D 7/22* (2010.01)
*B67D 7/04* (2010.01)

(52) U.S. Cl.
CPC ........... *B67D 7/221* (2013.01); *B67D 7/0401* (2013.01); *B67D 2007/0474* (2013.01)

(58) Field of Classification Search
CPC .............. B67D 7/221; B67D 7/0401; B67D 2007/0474; B67D 7/085; G01F 15/10; F17C 2270/0139
USPC ........................................................ 141/94
See application file for complete search history.

(56) References Cited

U.S. PATENT DOCUMENTS

| | | | | |
|---|---|---|---|---|
| 4,005,412 A * | 1/1977 | Leander | ................. | B67D 7/221 340/870.39 |
| 6,401,767 B1 * | 6/2002 | Cohen | ................. | B67D 7/3236 141/192 |
| 6,619,336 B2 * | 9/2003 | Cohen | ................. | F17C 13/02 141/82 |
| 6,708,573 B1 * | 3/2004 | Cohen | ................. | G01F 1/125 73/865 |
| 6,745,801 B1 * | 6/2004 | Cohen | ................. | C01B 3/00 141/2 |
| 6,786,245 B1 * | 9/2004 | Eichelberger | ............. | F17C 5/06 141/2 |
| 7,028,724 B2 * | 4/2006 | Cohen | ................. | F02M 21/0293 141/94 |

(Continued)

FOREIGN PATENT DOCUMENTS

| | | | | |
|---|---|---|---|---|
| EP | 3896028 | * | 10/2021 | ............. B67D 7/425 |
| EP | 3896028 A1 | * | 10/2021 | ............. B67D 7/425 |

*Primary Examiner* — Timothy L Maust
*Assistant Examiner* — Christopher M Afful
(74) *Attorney, Agent, or Firm* — Matthew R. Weaver

(57) ABSTRACT

An apparatus and process for preventive maintenance for nozzle elements of a fuel dispenser or recharging station can include a nozzle preventive maintenance apparatus (e.g. fuel dispenser nozzle preventive maintenance apparatus or vehicle recharging nozzle preventive maintenance apparatus). The nozzle preventive maintenance apparatus can be configured to communicate with a sensor element of a nozzle to evaluate the operational status of that sensor element. In the event the testing determines that the sensor element is malfunctioning or broken, the apparatus can respond by scheduling or ordering maintenance to repair the component so the failure can be identified quickly and resolved to try and avoid the chance that a user may attempt to utilize a nozzle with a non-functioning element and have a negative experience in use of a dispenser (e.g. fuel dispenser or electricity dispenser that can be considered a recharging station).

16 Claims, 4 Drawing Sheets

(56) References Cited

U.S. PATENT DOCUMENTS

| | | | | |
|---|---|---|---|---|
| 7,328,726 B2* | 2/2008 | Cohen | ................ | G05D 23/1393 |
| | | | | 141/105 |
| 7,793,675 B2* | 9/2010 | Cohen | ................... | B01F 35/213 |
| | | | | 73/31.03 |
| 7,921,883 B2* | 4/2011 | Cohen | .................... | F17C 5/007 |
| | | | | 700/83 |
| 8,020,589 B2* | 9/2011 | Cohen | ................... | F17C 13/025 |
| | | | | 141/234 |
| 8,286,675 B2* | 10/2012 | Farese | .................... | F17C 5/007 |
| | | | | 141/94 |
| 8,365,777 B2* | 2/2013 | Farese | ................... | F17C 13/025 |
| | | | | 141/94 |
| 8,453,682 B2* | 6/2013 | Bonner | .................... | F17C 5/06 |
| | | | | 141/47 |
| 8,899,278 B2* | 12/2014 | Cohen | .................... | F17C 7/02 |
| | | | | 141/94 |
| 9,074,730 B2* | 7/2015 | Cohen | ...................... | F17C 5/06 |
| 9,151,448 B2* | 10/2015 | Cohen | ...................... | F17C 5/06 |
| 9,261,238 B2* | 2/2016 | Cohen | ...................... | F17C 5/06 |
| 9,279,541 B2* | 3/2016 | Cohen | .................... | F17C 13/026 |
| 9,404,620 B2* | 8/2016 | Cohen | ................... | F17C 13/002 |
| 9,863,583 B2* | 1/2018 | Youlio | .................. | F17C 13/025 |
| 10,502,649 B1* | 12/2019 | Cohen | .................... | B65D 83/14 |
| 10,508,770 B2* | 12/2019 | Cohen et al. | ............. | F17C 5/06 |
| 2016/0167942 A1* | 6/2016 | Cornett | ................. | B67D 7/425 |
| | | | | 141/94 |
| 2019/0127209 A1* | 5/2019 | Bergqvist | ................ | G06F 21/44 |

\* cited by examiner

APPARATUS AND METHOD FOR FUEL DISPENSING NOZZLE MAINTENANCE OR VEHICLE BATTERY RECHARGING NOZZLE MAINTENANCE

TECHNICAL FIELD

The innovation relates to apparatuses and methods for hydrogen fuel dispensing, natural gas fuel dispensing, electric vehicle battery recharging and other types of processes and systems for dispensing fuel to a vehicle fuel tank or transmitting electricity to a battery for recharging the battery as well as systems and processes for detecting nozzle component failures in such systems for maintenance and repair of the failed component(s).

BACKGROUND

Examples of hydrogen generation and supply systems can be appreciated from U.S. Pat. Nos. 6,401,767, 6,474,078, 6,619,336, 6,708,573, 6,745,801, 6,786,245, 7,028,724, 7,328,726, 7,793,675, 7,921,883, 8,020,589, 8,286,675, 8,365,777, 8,453,682, 8,899,278, 9,074,730, 9,151,448, 9,261,238, 9,279,541, 9,404,620, 9,863,583, 10,502,649, and 10,508,770.

Dispensers of hydrogen fueling stations often include a nozzle that can be inserted into a fuel tank inlet for providing fuel to a vehicle. An operator can use a handle to manipulate the nozzle from a stowed position in which it is held at the dispenser and a dispensing position in which the dispenser is in a fuel tank inlet for feeding fuel into a fuel tank. After a user may use the nozzle for the fuel dispensing, the nozzle can be returned to its stowed position at the dispenser so another user can subsequently use the dispenser.

Often, a hydrogen fueling station dispenser can include a display that may display the amount of fuel fed into a vehicle while the nozzle is positioned for providing fuel to the vehicle fuel tank and fuel is being fed into the fuel tank via the nozzle. For instance, a display for such a dispenser will often show the dispensing pressure or the mass of fuel dispensed to the customer (e.g. dispensed into the fuel tank of the customer's vehicle). The mass of fuel that is displayed is often provided in metric units of mass (e.g. kilogram, or kg).

BRIEF SUMMARY OF THE INVENTION

During hydrogen fueling of a vehicle fuel tank, a dispenser can have a wireless communication connection with a vehicle to facilitate determination of how much more fuel is needed for filling a fuel tank. We determined that receivers and/or transceivers used in the nozzles of such devices often fail due to the environmental conditions of the device and the manner in which a nozzle having that transceiver or receiver can be manipulated by a user. When such a device breaks, it can prevent hydrogen fuel dispensing because a dispenser may not permit fuel to be dispensed without feedback on how full a fuel tank may or may not be as a safety precaution. We determined that this type of failure can create a negative user experience at a hydrogen fueling station. We also determined that such a problem can arise at other types of fueling stations (e.g. natural gas fueling stations having one or more natural gas fuel dispensers) and electric vehicle recharging stations having one or more electricity charging dispensers for recharging a battery of an electric vehicle.

We also determined that identification of such failures can be helpful for fueling station or recharging station operators so that they can avoid negative user experiences and provide improved fueling or recharging capacity and use of available dispensers. Embodiments of our apparatus, system, and process for proactively detecting a failure or error of a nozzle component and automatically fixing the issue and/or scheduling or requesting maintenance can help resolve such issues and improve user experiences at such facilities. Further, embodiments can help improve reliable availability of all dispensers at a station to provide improved station fueling and/or recharging capacity and station performance.

Embodiments can also be adapted to detect a need for a power cycle for a dispenser. For example, a detection of a dispenser programmable logic controller lock condition can occur via an embodiment of our apparatus and/or process. In the event such a detection is made, a dispenser can be restarted or otherwise have its power cycled off and on to address such an issue. Embodiments can permit automated, remote detection of such occurrences to help further improve reliable availability of all dispensers at a station to provide improved dispensing capacity and station performance.

In a first aspect, an apparatus for nozzle maintenance of a nozzle can include a nozzle maintenance detector positionable at a dispenser to communicate with a nozzle receiver element of a nozzle when the nozzle is in a stowed position of the nozzle. The nozzle maintenance detector can be configured such that a test signal from a controller is transmittable to the nozzle receiver element when the nozzle is in the stowed position and a test signal response to the test signal sent to the nozzle receiver element is receivable at the controller to evaluate the test signal response to determine whether to trigger initiation of at least one maintenance activity.

In a second aspect, the apparatus can include the nozzle. The nozzle can be a nozzle of a hydrogen fuel dispenser or natural gas dispenser. Alternatively, the nozzle can be a nozzle of an electric vehicle recharging station dispenser.

In a third aspect, the one or more maintenance activities can include at least one of: (i) automatic initiation of a nozzle receiver element cleaning operation; (ii) automatic cycling of power to the nozzle receiver element to restart the nozzle receiver element; (iii) automatic cycling of power to the dispenser to restart the controller or a controller of the dispenser; and (iv) automatic sending of at least one communication to a user communication device to initiate scheduling of repair or replacement of the nozzle receiver element. In some embodiments, the one or more maintenance activities can include all of (i) through (iv). Other embodiments can include any combination of two or more of activities (i), (ii), (iii), and (iv).

For example, the at least one maintenance activity can include performance of a first maintenance activity comprising automatic cycling of power to the nozzle receiver element to restart the nozzle receiver element and/or performance of a second maintenance activity comprising automatic cycling of power to the dispenser to restart the controller or a controller of the dispenser. Embodiments can also include performance of a third maintenance activity comprising automatic sending of at least one communication to a user communication device to initiate scheduling of repair or replacement of the nozzle receiver element.

In a fourth aspect, the nozzle maintenance detector can be configured such that the test signal from the controller is transmittable to the nozzle receiver element at a pre-defined maintenance check time period. Examples of the pre-defined maintenance check time period include 1 second, 30 seconds, 1 minute, 30 minutes, 45 minutes, 1 hour, or 2 hours. Other suitable time periods could also be utilized.

In a fifth aspect, the nozzle maintenance detector can also be configured such that a test signal from a controller is transmittable to a receiver element of the nozzle maintenance detector when the nozzle is in the stowed position and a test signal response to the test signal sent to the nozzle maintenance detector is receivable at the controller to evaluate the test signal response to determine whether to trigger initiation of the at least one maintenance activity.

In a sixth aspect, the controller can be a controller of the dispenser that is communicatively connected to the nozzle maintenance detector. In some embodiments, the apparatus can include the dispenser, the controller, and the nozzle. The nozzle can be connected to the dispenser via a flexible hose.

In a seventh aspect, one or more features of the second aspect, third aspect, fourth aspect, fifth aspect and/or sixth aspect can be included in the first aspect. It should therefore be appreciated that other embodiments of the apparatus can utilize numerous different elements to meet a particular set of design criteria.

In an eighth aspect, a process for nozzle maintenance is provided that can include detecting use of a nozzle of a dispenser for fueling or recharging has ended, testing a nozzle receiver element of the nozzle to verify functionality of the receiver element after a pre-defined maintenance check time period has elapsed after the detecting of the use of the nozzle has ended and, in response to detection of an error from the testing of the nozzle receiver element, automatically initiating at least one maintenance activity.

It should be appreciated that embodiments of our apparatus can be configured to implement an embodiment of our process.

In a ninth aspect, the at least one maintenance activity that can be initiated can include (i) automatic initiation of a cleaning operation; (ii) automatic cycling of power to the nozzle receiver element to restart the nozzle receiver element; (iii) automatic cycling of power to the dispenser to restart a controller of the dispenser; and/or (iv) automatic sending of at least one communication to a user communication device to initiate scheduling of repair or replacement of the nozzle receiver element. Some embodiments can include utilization of just one of these items and other embodiments can include a combination of two or more of these activities or all of these activities.

Embodiments of the process can include, for example, performance of the initiating of the at least one maintenance activity so it includes performance of a first maintenance activity comprising automatic cycling of power to the nozzle receiver element to restart the nozzle receiver element and/or performance of a second maintenance activity comprising automatic cycling of power to the dispenser to restart the controller or a controller of the dispenser. In some implementations, the performance of the second maintenance activity can occur after the performance of the first maintenance activity occurs.

Yet other embodiments can also include performance of a third maintenance activity comprising automatic sending of at least one communication to a user communication device to initiate scheduling of repair or replacement of the nozzle receiver element. In some implementations, the performance of the third maintenance activity can occur after the performance of the first maintenance activity occurs and/or the performance of the third maintenance activity can occur after the performance of the second maintenance activity occurs.

In a tenth aspect, the pre-defined maintenance check time period can be 1 second, 30 seconds, 1 minute, 30 minutes, 45 minutes, 1 hour, or 2 hours. In other embodiments, the pre-defined maintenance check time period can be another suitable time period.

In an eleventh aspect, the dispenser used in an embodiment of the process can be a dispenser for hydrogen fueling or natural gas fueling. Alternatively, the dispenser can be a dispenser of an electric vehicle charging station for recharging a battery of the vehicle.

In a twelfth aspect, the testing of the nozzle receiver element of the nozzle to verify functionality of the receiver element can include sending a test signal to the nozzle receiver element and comparing a test signal response received from a nozzle transmitter element of the nozzle with the test signal to determine whether at least one field of data of the test signal matches at least one corresponding field of data of the test signal response. In some embodiments, the at least one field of data of the test signal can include a software version field and/or a protocol identification field and the at least one corresponding field of data of the test signal response can include a software version field and/or a protocol identification field.

In a thirteenth aspect, the testing of the nozzle receiver element of the nozzle to verify functionality of the receiver element can include sending a test signal to the nozzle receiver element and comparing a test signal response received from a nozzle transmitter element of the nozzle with the test signal to determine whether at least one field of data of the test signal matches at least one corresponding field of data of the test signal response. The testing can also include sending a test signal to a receiver element of a nozzle maintenance detector and comparing a test signal response received from a transmitter element of the nozzle maintenance detector with the test signal to determine whether at least one field of data of the test signal matches at least one corresponding field of data of the test signal response received from a transmitter element of the nozzle maintenance detector.

In a fourteenth aspect, embodiments of the process of the eighth aspect can include one or more features of other aspects, such as the ninth, tenth, eleventh, twelfth, and/or thirteen aspects. It should therefore be appreciated that embodiments of the process can include numerous other features or steps. Also, embodiments of the apparatus can be configured to perform such an embodiment of the process.

Other details, objects, and advantages of my apparatuses for fuel dispensing, systems for dispensing fuel (e.g. hydrogen, natural gas, etc.) to a vehicle fuel tank or dispensing electricity to a battery for recharging the battery, systems and apparatuses for evaluating a component of a nozzle for dispensing of fuel to a vehicle fuel tank or recharging of a vehicle battery, and methods of making and using the same will become apparent as the following description of certain exemplary embodiments thereof proceeds.

BRIEF DESCRIPTION OF THE DRAWINGS

Exemplary embodiments of apparatuses for hydrogen dispensing, natural gas dispensing, and vehicle battery recharging, processes for preventive maintenance for nozzle elements of a fuel dispenser or recharging station, a nozzle maintenance apparatus (e.g. fuel dispenser nozzle maintenance apparatus or vehicle recharging nozzle maintenance apparatus), and methods of making and using the same are shown in the drawings included herewith. It should be understood that like reference characters used in the drawings may identify like components.

DETAILED DESCRIPTION

Figure 1:
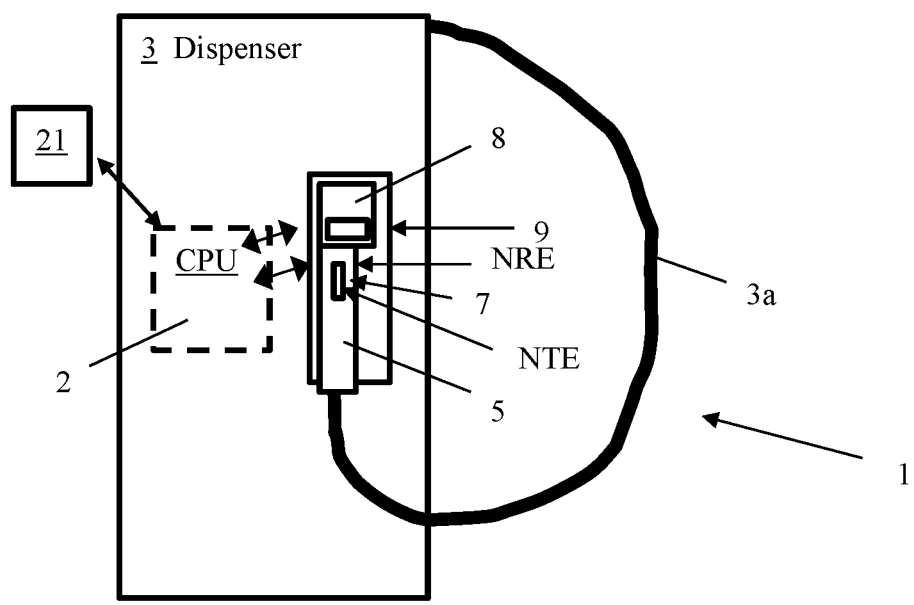
FIG. 1 is a schematic block diagram of a first exemplary embodiment of a dispensing apparatus that includes an exemplary embodiment of a nozzle maintenance apparatus. The dispensing apparatus can dispense a fuel such as hydrogen or methane for a vehicle fuel tank. Alternatively, the dispensing apparatus can be an electric vehicle recharging station that dispenses electricity to recharge a vehicle's battery.

Referring to FIGS. 1-4, a fueling dispenser 3 or recharging dispenser 3 can include an apparatus 1 for nozzle maintenance. The nozzle 5 of the dispenser 3 can be a fuel nozzle for dispensing a fuel into a fuel tank (e.g. a nozzle for feeding hydrogen or natural gas into a fuel tank of a vehicle) or a charger plug nozzle for inserting into an electric vehicle for recharging of the vehicle's battery. The nozzle 5, when used for electric vehicle recharging, can be considered an adapter, charging connector, plug, or a charger.

The nozzle 5 can be connected to a flexible hose 3a or other type of conduit that can extend from the body of the dispenser 3 to the nozzle 5 to facilitate the transmission of electricity or the flow of a fuel (e.g. hydrogen or natural gas, etc.) from the dispenser 3 to a vehicle.

The nozzle 5 can be moveable between a stowed position in which the nozzle 5 is held at the dispenser 3 via a nozzle holder 8 and a use position in which the nozzle 5 is positioned into a fuel tank or a plug for charging the battery of an electric vehicle. The flexible hose 3a or other type of conduit can move to accommodate motion of the nozzle 5 between its stowed position and use position to facilitate the nozzle's connection with a vehicle for fueling and/or recharging of the vehicle and subsequent storage at the dispenser 3 for being used by another user after the fueling or recharging is completed.

The dispenser 3 can include a controller 2 (CPU). The controller (CPU) 2 can include a processor as well as other hardware elements (e.g. memory, etc.) to facilitate control and operation of the dispenser 3 for the dispensing of a fuel or electricity for battery recharging. The controller 2 can be communicatively connected to a nozzle maintenance detector 9 that is integrated into the dispenser 3 to communicate with a nozzle transceiver 7 attached to the nozzle 5 or otherwise integrated into the nozzle 5. The nozzle transceiver 7 can include at least one nozzle receiver element NRE and at least one nozzle transmitter element NTE. The nozzle transceiver 7 can be compatible with the communication type of data transmission from the transceiver of the nozzle maintenance detector 9 so that communications can be exchanged between these elements.

The nozzle maintenance detector 9 can include at least one detector transmitter element for sending a test signal to at least one nozzle receiver element NRE. The nozzle maintenance detector 9 can also include at least one detector receiver element to receive a response to the test signal from a nozzle transmitter element NTE of the nozzle 5. Such a received response can then be provided to the controller 2 via a communication connection between the controller 2 and the nozzle maintenance detector 9. In other embodiments, the nozzle maintenance detector 9 may only include at least one transmitter element and any response to the test signal provided by the nozzle 5 can be received by the controller 2 directly from the nozzle 5 (e.g. via a transmitter element of the nozzle 5).

As shown in FIG. 1, for example, the nozzle maintenance detector 9 can be a wireless transmitter or include a wireless transmitter or a wireless communication transceiver such as, for example, an infrared transceiver, a Bluetooth transceiver, or a near field communication transceiver. The nozzle transceiver 7 can also include a wireless transceiver such as, for example, an infrared transceiver, a Bluetooth transceiver, or a near field communication transceiver as well. Such a nozzle transceiver 7 can include at least one nozzle receiver element NRE and at least one nozzle transmitter element NTE. Alternatively, the nozzle 5 may not have a transceiver and may instead include at least one nozzle receiver element NRE and, at least in some embodiments, can also include at least one nozzle transmitter element NTE.

The nozzle maintenance detector 9 can be positioned on or within a nozzle holder 8 of the dispenser so that the nozzle transceiver 7, nozzle receiver element NRE, and/or nozzle transmitter element NTE are positioned within a wireless range of the nozzle maintenance detector 9 when the nozzle 5 is in its stowed position for detection of the nozzle 5 and communication with the nozzle transceiver 7 when the nozzle is in the stowed position. For instance, the nozzle transceiver 7, nozzle receiver element NRE and/or nozzle transmitter element NTE can be within a pre-selected detection distance from the dispenser's nozzle maintenance detector 9 when the nozzle is in the stowed position via the position of the nozzle maintenance detector 9 on or within the holder 8 (e.g. the stowed position of the nozzle 5 can place the nozzle transceiver 7 within a wireless communication range of a transmitter element of the nozzle maintenance detector 9, etc.).

Figure 3:
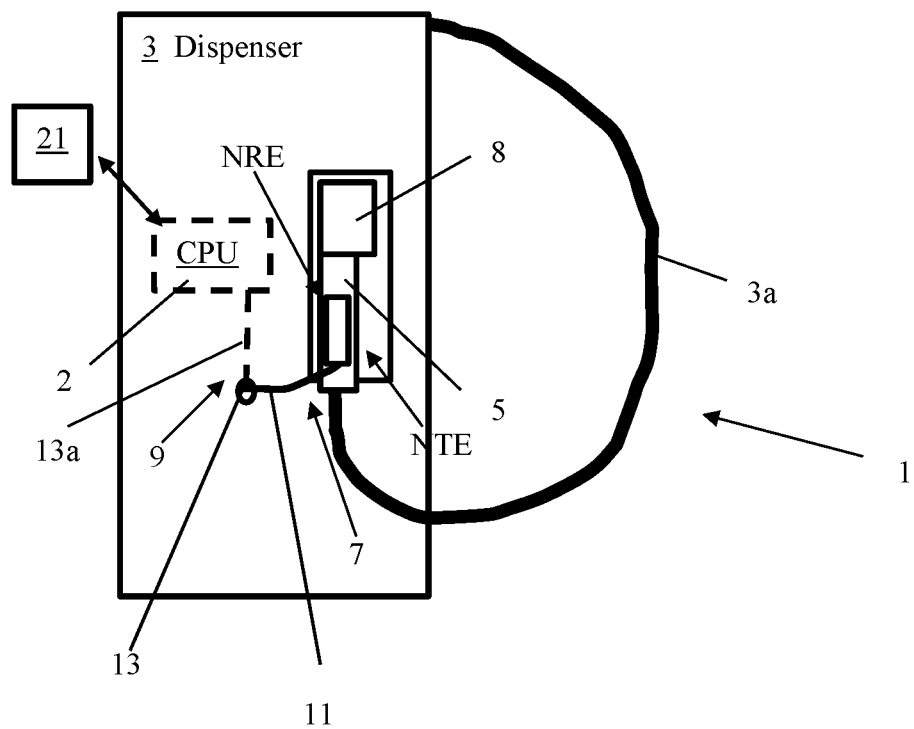
FIG. 3 is a schematic block diagram of a second exemplary embodiment of a dispensing apparatus that includes an exemplary embodiment of a nozzle maintenance apparatus.

As shown in FIG. 3, the nozzle maintenance detector 9 can alternatively be a communication interface that includes a hardwired communicative connection 13a between the controller 2 and the nozzle transceiver 7. Examples of such a hardwired connection 13a can include, for example, a SAE International standard J1772 compatible connector, a Combined Charging System (CCS) Combo Type 1 connector or a CCS Combo type 2 connector. This type of hardwired connection can be facilitated by the nozzle transceiver 7 including a wired connection and a plug 11 for inserting into an aperture 13 of the dispenser 3 that is configured to facilitate the hardwired connection with the dispenser nozzle maintenance detector 9. When the plug is inserted into the aperture 13, the nozzle 5 can be detected as being in its stowed position for performance of a maintenance check process.

The wired connection and plug 11 can also be adapted and configured to permit movement of the plug so the plug can be removed from aperture 13 and inserted into a receptacle of a vehicle to provide a hardwired communicative connection to the vehicle when the nozzle 5 is in its use position for fueling and/or recharging so data from the vehicle (e.g. a vehicle computer, a sensor of the vehicle's fuel tank, a device of the vehicle's battery being recharged, etc.) can be provided to the controller 2 during fueling or recharging via a hardwired connection facilitated by the wired connection and plug 11. When the plug is not within the aperture 13 for a hardwired communicative connection with the controller 2, the nozzle 5 can be detected as being in its use position for performance of fueling or recharging.

It should be appreciated that the nozzle maintenance detector 9 can also be or include another type of communication interface for exchanging communications with the nozzle transceiver 7 via a wired communicative connection and/or wireless communicative connection. The nozzle maintenance detector 9 can be configured to facilitate a communicative connection for transmission of data between the controller 2 and the nozzle transceiver 7 in various different other ways in other embodiments.

The nozzle transceiver 7 can be configured for communication with a vehicle during fueling or recharging to provide data to the controller 2 of the dispenser concerning the fueling or recharging. The data can be communicated to the controller 2 via a transceiver or receiver of the controller 2 or via a receiver of the nozzle maintenance detector 9 that is communicatively connected to the controller 2.

The type of data that can be communicated from the nozzle transceiver 7 to the controller 2 can include fuel tank information related to how full the fuel tank of the vehicle may be or how charged the battery of a vehicle may be, for example. The controller 2 can use that data during fueling or recharging to facilitate a completion of the fueling or recharging and provide a display of indicia to a user related to the fueling or recharging status during use of the dispenser 3. These types of communications between the nozzle transceiver 7, vehicle being charged or fueled, and the controller 2 can occur when the nozzle 5 is in its use position.

After use, the nozzle 5 can be moved back to its stowed position via the holder 8 of the dispenser 3, for example. After the fueling or recharging has stopped and the nozzle 5 is returned to its stowed position, the controller 2 can initiate a maintenance check via the nozzle maintenance detector 9 to determine whether the nozzle transceiver 7 is functioning properly or needs replaced or repaired. If the maintenance check results in a determination that the nozzle transceiver 7 needs repaired or replaced, the controller 2 can initiate a maintenance task—such as restarting of the dispenser so that the entire unit automatically turns off and on, performing an automated nozzle transceiver cleaning process, and/or automatically sending a notification to a user communication device 21 to initiate the scheduling of a manual repair or replacement of the nozzle transceiver 7.

This maintenance check that can be performed via the controller 2 and nozzle maintenance detector 9 can be performed periodically so that it is performed regularly at pre-defined maintenance check time periods (e.g. every 1 second, every 30 seconds, every 1 minute, every 30 minutes, every 45 minutes, every hour, after two hours, etc.). For example, the pre-defined maintenance check time period can be defined so that the maintenance check for the nozzle transceiver 7 is initiated after a fueling has occurred by the controller 2 starting a timer and, after the pre-defined maintenance check time period has elapsed, initiating performance of the maintenance check via the nozzle maintenance detector 9. The timer can then be re-initiated after the maintenance check is completed so that second maintenance check is performed after the pre-defined maintenance check time period has again elapsed. This maintenance check process can be repeated numerous times between nozzle uses for fueling or recharging.

Alternatively, the controller 2 can be configured to facilitate performance of the maintenance check on a relatively continuous basis so that the maintenance check is performed soon after a fueling has ended and is subsequently re-performed after each maintenance check has been successfully completed. This maintenance check process can be performed consistently between nozzle uses for fueling or recharging.

The type of nozzle transceiver maintenance check that can be performed via the controller 2 and nozzle maintenance detector 9 can include a communication check to verify that the nozzle transceiver 7 is not damaged or experiencing a failure that prevents it from communicating with a vehicle device during the fueling or recharging of a vehicle.

The nozzle maintenance check that is performed can be considered a testing of the nozzle transceiver 7, for example. The nozzle transceiver testing process can include the controller 2 sending a test signal to the nozzle transceiver 7 via the nozzle maintenance detector 9 or via a transmitter of the controller 2 in response to the nozzle maintenance detector detecting the nozzle transceiver 7 within its range of communication. If the nozzle transceiver 7 is working properly, the nozzle transceiver 7 can respond to this test signal to provide a data transmission to the transceiver of the nozzle maintenance detector 9 or a receiver of the controller 2. The controller 2 can obtain this response from the nozzle transceiver 7 and compare that response with data of the test signal to determine whether the test signal response indicates the nozzle transceiver 7 is working properly or has experienced an error or failure. In response to no error or failure being identified, the maintenance check may then be re-performed within the next pre-defined maintenance check time period.

The nozzle transceiver maintenance check that can be performed via the controller 2 and nozzle maintenance detector 9 can also include a communication check to verify that the nozzle maintenance detector 9 is not damaged or experiencing a failure that prevents it from communicating with the controller 2 and/or the nozzle transceiver 7 as well. This maintenance process can also include the controller 2 or the nozzle transceiver 7 sending a test signal to the maintenance detector 9 via a transmitter of the nozzle transceiver 7 or via a transmitter of the controller 2 in response to the nozzle transceiver 7 detecting the maintenance detector 9 being within its range of communication. If the nozzle maintenance detector 9 is working properly, the nozzle maintenance detector 9 can respond to this test signal to provide a data transmission to the transceiver of the nozzle transceiver 7 or a receiver of the controller 2. The controller 2 can obtain this response from the nozzle maintenance detector 9 and compare that response with data of the test signal to determine whether the test signal response indicates the nozzle maintenance detector 9 is working properly or has experienced an error or failure. In response to no error or failure being identified, the maintenance check may then be re-performed within the next pre-defined maintenance check time period.

An exemplary testing process initiated and monitored by the controller 2 can include, for example, initiating the sending of a test signal from the transceiver or transmitter of the nozzle maintenance detector 9 to the nozzle transceiver 7 so that a receiver of the nozzle transceiver receives the test signal. The test signal can include a pre-defined test message that includes various pre-defined fields that is configured so that the nozzle transmitter of the nozzle transceiver 7 will send a response to the test signal that provides the same information from one or more of the fields of the test signal in the response that is sent by the nozzle transmitter of the nozzle transceiver 7. The controller 2 can receive the nozzle transceiver response via a receiver of the nozzle maintenance detector or other receiver to which the controller 2 is communicatively connected that can receive the test signal response from the nozzle transceiver 7. The controller 2 can then compare the nozzle transceiver response to the test signal to data of the test signal to determine whether the response sufficiently corresponds. The comparison performed by the controller 2 can compare the entirety of the test signal and the test signal response to determine whether it is a perfect match of data. Alternatively, the comparison performed by the controller 2 can be a comparison of data included in one or more fields of the test signal with corresponding data included in one or more fields of the nozzle transceiver response to the test signal. The one or more fields of the test signal and the one or more corresponding fields of the test signal response can be defined in a communication protocol utilized for the communication of data between the controller 2 and the nozzle transceiver 7.

An exemplary testing process initiated and monitored by the controller 2 can also include, for example, initiating the sending of a test signal from the transceiver or transmitter of the nozzle transceiver 7 to the nozzle maintenance detector 9 so that a receiver of the nozzle maintenance detector 9 receives the test signal. The test signal can include a pre-defined test message that includes various pre-defined fields that is configured so that the transmitter of the nozzle maintenance detector 9 will send a response to the test signal that provides the same information from one or more of the fields of the test signal in the response that is sent by the transmitter of the nozzle maintenance detector 9. The controller 2 can receive the nozzle maintenance detector 9 response via a receiver of the nozzle maintenance detector 9, the receiver of the nozzle transceiver 7, or other receiver to which the controller 2 is communicatively connected that can receive the test signal response from the nozzle maintenance detector 9. The controller 2 can then compare the nozzle maintenance detector 9 response to the test signal to data of the test signal to determine whether the response sufficiently corresponds. The comparison performed by the controller 2 can compare the entirety of the test signal and the test signal response to determine whether it is a perfect match of data. Alternatively, the comparison performed by the controller 2 can be a comparison of data included in one or more fields of the test signal with corresponding data included in one or more fields of the nozzle maintenance detector 9 response to the test signal. The one or more fields of the test signal and the one or more corresponding fields of the test signal response can be defined in a communication protocol utilized for the communication of data between the controller 2 and the nozzle maintenance detector 9 and/or the controller and the nozzle transceiver 7.

The type of fields that can be utilized for the test signal field(s) and the corresponding field(s) for the test signal responses (e.g. responses from the nozzle transceiver 7 as well as a response from the nozzle maintenance detector 9 where that device may also be tested) can include, for example, an identifier field, a protocol identifier field, a body of a message field, or other type of pre-defined field that can be selected and meet a pre-selected set of design criteria for the test signal and test signal response transmissions.

For example, a pre-defined header of a message of the test signal or a pre-defined field of the test signal can include a protocol identifier field and/or an identifier field and/or a software version field. One of these types of fields or all of these fields can include a pre-selected set of data (e.g. string of text, string of numbers, string of alphanumeric data, etc.) in the test signal that can be compared with the same field(s) in the test signal response message to determine whether they match or not. If the data matches, the nozzle transceiver 7 or the nozzle maintenance detector 9 can be determined to be working properly. If the data in these one or more fields of the test signal and response to the test signal fail to match, the nozzle transceiver 7 or the nozzle maintenance detector 9 can be determined to have an error that needs resolved and can trigger the automatic initiation of one or more maintenance activities by the controller 2.

For example, in the event an error is identified from the nozzle transceiver's response to the test signal, the controller 2 can be configured to initiate performance of at least one pre-defined nozzle maintenance activity. The maintenance activity can include one or more of: (1) automatic initiation of a nozzle transceiver cleaning operation or nozzle receiver element NRE cleaning operation via the holder 8, (2) automatic cycling of power to the nozzle transceiver 7 or nozzle receiver element NRE to restart the nozzle transceiver 7 or nozzle receiver element NRE, (3) automatic cycling of power to the dispenser 3 to restart the controller 2 of the dispenser and related components to resolve a controller lock condition that may be indicated by the error, and (4) sending at least one communication to a user communication device 21 to initiate scheduling of repair or replacement of the nozzle transceiver 7 or nozzle receiver element NRE.

After each maintenance activity is performed, the nozzle receiver element or nozzle transceiver 7 can be tested to verify its functionality. If the testing results in detection of an error, another maintenance activity can be performed as noted above. However, if that testing indicates that there is no longer an error or failure, the process can be stopped and the test signal can again be sent after a pre-defined maintenance check time period has elapsed as discussed herein.

As another example, in the event an error is identified from the nozzle maintenance detector's response to the test signal it was sent via the nozzle transceiver 7, the controller 2 can be configured to initiate performance of at least one pre-defined nozzle maintenance activity. The maintenance activity can include one or more of: (1) automatic initiation of a nozzle maintenance detector 9 transceiver cleaning operation or nozzle maintenance detector receiver element NRE cleaning operation via the holder 8, (2) automatic cycling of power to the nozzle maintenance detector 9 or receiver element of the nozzle maintenance detector 9 to restart the nozzle maintenance detector 9 or nozzle receiver element of the nozzle maintenance detector 9, (3) automatic cycling of power to the dispenser 3 to restart the controller 2 of the dispenser and related components to resolve a controller lock condition that may be indicated by the error, and (4) sending at least one communication to a user communication device 21 to initiate scheduling of repair or replacement of the nozzle maintenance detector 9 or receiver element of the nozzle maintenance detector 9.

After each maintenance activity is performed, the nozzle receiver element, nozzle transceiver 7, nozzle maintenance detector 9, or nozzle maintenance detector 9 receiver element can be tested to verify its functionality. If the testing results in detection of an error, another maintenance activity can be performed as noted above. However, if that testing indicates that there is no longer an error or failure, the process can be stopped and the test signal can again be sent after a pre-defined maintenance check time period has elapsed as discussed herein.

The maintenance activity that is to be performed by the controller 2 can be pre-defined so that more than one activity may be attempted in a pre-defined sequence. For example, the controller 2 may first initiate automatic cycling of power to the nozzle transceiver 7 or nozzle receiver element NRE to restart the nozzle transceiver 7 or nozzle receiver element NRE to attempt to resolve the error and then initiate sending of the test signal to the nozzle transceiver or nozzle receiver element NRE to determine whether this resolved the nozzle transceiver error or nozzle receiver element error. If the response to this test signal after the first maintenance activity was performed results in a comparison of the test signal response to the test signal showing that no failure or error is present, the action can be considered as having resolved the issue and a maintenance check may then be re-performed after the pre-defined maintenance check time period has elapsed after resolution of the issue.

However, if the response to the test signal after the first maintenance activity was performed still results in a detection of an error, the controller may proceed with initiating a second maintenance activity. This second activity can be, for example, automatic cycling of power to the dispenser 3 to restart the controller 2 of the dispenser and related components to resolve a controller lock condition that may be indicated by the error. After this restart of the second maintenance activity, the controller 2 can initiate sending of the test signal to the nozzle transceiver to determine whether this resolved the nozzle transceiver error. If the response to this test signal after the second maintenance activity was performed results in a comparison of the test signal with the test signal response showing that no error or failure was detected, the issue can be considered resolved and a maintenance check may then be re-performed after the pre-defined maintenance check time period has elapsed.

In the event the response to the test signal after the second maintenance activity was performed still results in a detection of an error or failure, the controller 2 can proceed with initiating a third maintenance activity. This third maintenance activity can include sending at least one communication to a user communication device 21 to initiate scheduling of repair or replacement of the nozzle transceiver 7 or nozzle receiver element NRE. After the nozzle transceiver 7 or nozzle receiver element NRE is repaired or replaced, the controller 2 can resume periodic maintenance checks.

Alternatively, the third maintenance activity that may be performed can be an automatic initiation of a nozzle transceiver cleaning operation via the holder 8 or nozzle receiver element NRE cleaning operation via the holder 8. This cleaning operation can be initiated by the controller so that a fluid (e.g. air, water, etc.) is directed at the nozzle 5 where the nozzle transceiver 7 is located when the nozzle is in its stowed position to clean the nozzle 5 and nozzle transceiver area. After this cleaning operation is performed, the controller 2 can initiate sending of the test signal to the nozzle transceiver 7 or nozzle receiver element NRE to determine whether this resolved the nozzle transceiver error or nozzle receiver element NRE error. If the response to this test signal after the third maintenance activity was performed results in a comparison of the test signal with the test signal response showing that no error or failure was detected, the issue can be considered resolved and a maintenance check may then be re-performed after the pre-defined maintenance check time period has elapsed.

In the event the response to the test signal after the third maintenance activity was performed still results in a detection of an error or failure, the controller 2 can proceed with initiating a fourth maintenance activity. This fourth maintenance activity can include sending at least one communication to a user communication device 21 to initiate scheduling of repair or replacement of the nozzle transceiver 7 or nozzle receiver element NRE. After the nozzle transceiver 7 or nozzle receiver element NRE is repaired or replaced, the controller 2 can resume periodic maintenance checks.

It should be appreciated that other pre-defined sequences of maintenance activity can be utilized. For example, the controller 2 can perform the above noted second maintenance activity first and the first maintenance activity second in some alternative embodiments (in which case, the second maintenance activity noted above can be considered a first maintenance activity and the above noted first maintenance activity can be considered the second maintenance activity since it would occur second in such an exemplary sequence).

As another example, only one of the first and second maintenance activities may be performed before the third maintenance activity (e.g. the cleaning operation or requesting of repair work) is performed. In such an embodiment, the third maintenance activity can be considered a second maintenance activity and the other maintenance activity can be considered the first maintenance activity.

As yet another example, a pre-defined sequence of maintenance activity can only include the fourth maintenance activity. It should be appreciated that when only the fourth maintenance activity is performed, that activity can be considered the first maintenance activity.

In yet other maintenance activity sequences, a detection of an error in the nozzle maintenance detector 9 response to a testing can result in other maintenance activities. For example, the controller 2 may first initiate automatic cycling of power to the nozzle maintenance detector 9 or receiver element of the nozzle maintenance detector 9 to restart the nozzle maintenance detector 9 or receiver element of the nozzle maintenance detector 9 to attempt to resolve the error and then initiate sending of the test signal to the nozzle maintenance detector 9 or receiver element NRE of the nozzle maintenance detector 9 to determine whether this resolved the nozzle maintenance detector 9 error. If the response to this test signal after the first maintenance activity was performed results in a comparison of the test signal response to the test signal showing that no failure or error is present, the action can be considered as having resolved the issue and a maintenance check may then be re-performed after the pre-defined maintenance check time period has elapsed after resolution of the issue.

However, if the response to the test signal after the first maintenance activity was performed still results in a detection of an error, the controller may proceed with initiating a second maintenance activity. This second activity can be, for example, automatic cycling of power to the dispenser 3 to restart the controller 2 of the dispenser and related components to resolve a controller lock condition that may be indicated by the error. After this restart of the second maintenance activity, the controller 2 can initiate sending of the test signal to the nozzle maintenance detector 9 to determine whether this resolved the nozzle maintenance detector error. If the response to this test signal after the second maintenance activity was performed results in a comparison of the test signal with the test signal response showing that no error or failure was detected, the issue can be considered resolved and a maintenance check may then be re-performed after the pre-defined maintenance check time period has elapsed.

In the event the response to the test signal after the second maintenance activity was performed still results in a detection of an error or failure, the controller 2 can proceed with initiating a third maintenance activity. This third maintenance activity can include sending at least one communication to a user communication device 21 to initiate scheduling of repair or replacement of the nozzle maintenance detector 9 or receiver element of the nozzle maintenance detector 9. After the nozzle maintenance detector 9 or its receiver element is repaired or replaced, the controller 2 can resume periodic maintenance checks.

Alternatively, the third maintenance activity that may be performed can be an automatic initiation of a nozzle maintenance detector 9 cleaning operation via the holder 8 or nozzle maintenance detector receiver element cleaning operation via the holder 8. This cleaning operation can be initiated by the controller so that a fluid (e.g. air, water, etc.) is directed at the nozzle maintenance detector 9 where is receiver element is located to clean the nozzle maintenance detector 9 area. After this cleaning operation is performed, the controller 2 can initiate sending of the test signal to the nozzle maintenance detector 9 or its receiver element to determine whether this resolved the nozzle maintenance detector 9 error. If the response to this test signal after the third maintenance activity was performed results in a comparison of the test signal with the test signal response showing that no error or failure was detected, the issue can be considered resolved and a maintenance check may then be re-performed after the pre-defined maintenance check time period has elapsed.

In the event the response to the test signal after the third maintenance activity was performed still results in a detection of an error or failure, the controller 2 can proceed with initiating a fourth maintenance activity. This fourth maintenance activity can include sending at least one communication to a user communication device 21 to initiate scheduling of repair or replacement of the nozzle maintenance detector 9 or its receiver element NRE. After this repair or replacement work is finished, the controller 2 can resume periodic maintenance checks.

As yet another example, it should be appreciated that the pre-defined sequence of maintenance activity may utilize any order of the various restart and clean operations prior to performance of requesting or scheduling a repair. Other exemplary embodiments may also utilize other maintenance activities or yet other sequences of maintenance activities as well.

Until the nozzle transceiver 7 or nozzle receiver element NRE is repaired or replaced and/or the nozzle maintenance detector 9 and its receiver element is repaired or replaced after initiating of the third maintenance activity, the controller 2 can initiate the output of at least one indicia to indicate the dispenser is not available for use (e.g. initiate a display of text and/or images to indicate that the dispenser 3 is not available for use and/or turn on a light or turn off a light to indicate that the dispenser 3 is not available for use, etc.) or can be configured to take other corrective action to account for the identified error (e.g. reduce a fill speed for the fueling for that nozzle at the dispenser or limit a fill pressure to a lower pressure value to account for the fact that the nozzle transceiver may not work and that data from a vehicle may not be used to help facilitate fueling).

A user can provide input to the controller 2 after maintenance has occurred to trigger the removal of this indicia and resolution of the maintenance issue. The input may be provided by a user via a user communication device 21 or via a keypad or other user interface included at the dispenser 3 after the maintenance work is completed and the nozzle transceiver problem has been fixed. The controller 2 can respond to such input by resuming periodic maintenance checks after the nozzle transceiver problem or nozzle receiver element NRE problem is resolved so any new problem can subsequently be identified for resolution. As discussed above, such checks can occur at a pre-defined interval (e.g. every 15 minutes, every hour, every two hours, etc.) when the nozzle 5 is not in use for vehicle fueling or vehicle recharging.

Figure 2:
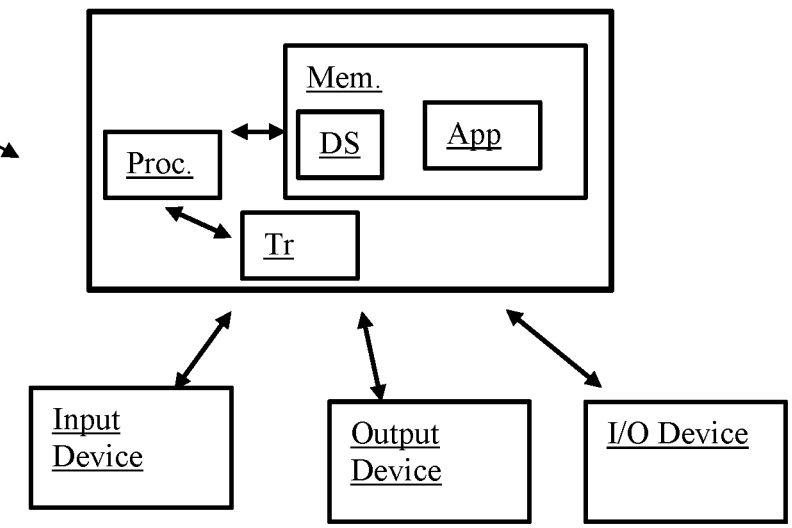
FIG. 2 is a perspective view of an exemplary embodiment of a communication device 21.

The type of user communication device 21 that can be utilized in conjunction with the dispenser 3 and its controller 2 may best be appreciated from FIGS. 1, 2, and 3. As may best be seen from FIG. 2, the user communication device 21 can be a computer device used for telecommunications, such as a smart phone, tablet, laptop computer, desktop personal computer, workstation, or other type of computer device. The user communication device 21 can include a processor (Proc.) connected to a non-transitory memory (Mem.) and at least one transceiver (Tr). The at least one transceiver can include a cellular data transceiver, a wireless network transceiver, a Bluetooth transceiver and/or other type of data communication transceiver for connection to one or more other devices or one or more networks (e.g. an access point, a base station, a router, etc.). The memory can have at least one data store (DS) and at least one application (App) stored thereon. The application can be run by the processor and the data store can include data (e.g. database, other stored data) that can be utilized when the processor runs the application. The processor can also generate a graphical user interface for display on an output device that includes a display or on a display of the communication device 21. The communication device can also include or be communicatively connected to at least one input device (e.g. a keyboard, a stylus, a touch screen, a microphone, etc.), at least one output device (a printer, a display, a speaker, etc.), and/or at least one input/output device (I/O device), such as a touch screen display, for example.

Figure 4:
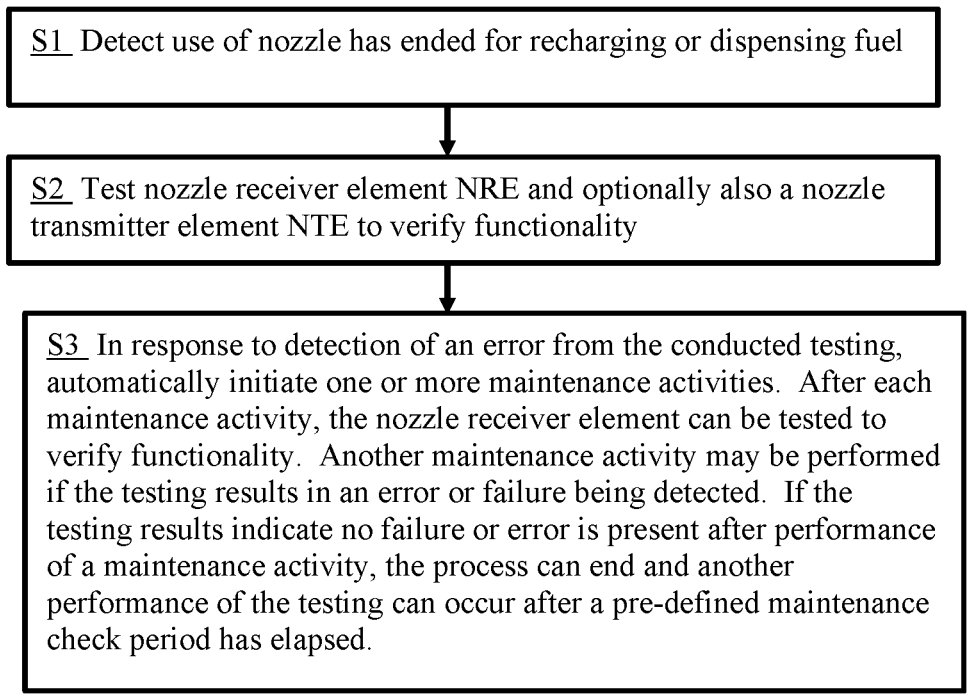
FIG. 4 is a flow chart illustrating an exemplary process for nozzle maintenance that includes detection of a nozzle component failure and responding to such a detection to perform one or more maintenance activities to resolve the detected failure. Exemplary embodiments shown in FIGS. 1 and 3 can be configured to utilize the exemplary process illustrated in FIG. 4.

FIG. 4 illustrates an exemplary process that can be performed by an embodiment of the apparatus 1. The performance of such a process can be defined by code stored in non-transitory memory of the controller 2 of the dispenser 3 that can be executive by a processor of the controller 2 to run the code and consequently perform the method defined by that code. For example, the process can include a first step S1 of detecting use of a nozzle 5 has ended for recharging or dispensing fuel at a dispenser 3. In a second step S2, the nozzle receiver element of the nozzle transceiver 7 or nozzle receiver element NRE can be tested to verify functionality of the nozzle transceiver 7 or nozzle receiver element NRE. The nozzle maintenance detector 9 and/or its receiver element may also be tested via a test signal as discussed above in this second step S2 as well. Such testing can include the sending of a test signal and evaluation of a response to the test signal that may be received from the nozzle transceiver 7 of the nozzle 5 (e.g. a nozzle transmitter element NTE of the nozzle transceiver 7) or a nozzle transmitter element NTE of the nozzle 5 as discussed above, for example. It can also include sending of a test signal and evaluation of a response to the test signal that may be received from the nozzle maintenance detector 9 as discussed above, in a third step S3, in response to detection of an error or failure from the conducted testing, one or more maintenance activities can be initiated automatically as discussed above. After each performed maintenance activity, the nozzle receiver element NRE or nozzle transceiver 7 and/or the nozzle maintenance detector 9 can again be tested to verify its functionality as discussed above. If the testing shows there is no longer an error or failure, the maintenance activity can be considered to have resolved the issue and the process can end and a new testing may occur after a pre-defined maintenance check time period has elapsed. If the testing after a conducted maintenance activity results in the error or failure again being detected, another maintenance activity can be initiated automatically as discussed above.

A request for maintenance and/or repair for the nozzle 5 and/or nozzle maintenance detector 9 can be made in response to detection of an error as another type of maintenance activity. This type of request can be performed after one or more other automatically initiated maintenance activities are actuated via the controller 2 failed to resolve a detected issue with the nozzle transceiver 7 or nozzle receiver element NRE or nozzle maintenance detector 9 as discussed above, for example. Or this type of request can be initiated as the first type of maintenance activity in other embodiments.

The process shown in FIG. 4 can also include other steps. For example, embodiments of the process can also include actuation of one or more indicia at the dispenser to indicate the dispenser is not available for use can be performed as discussed above (e.g. a light and/or display can be actuated to indicate the dispenser is not available for use). This can be performed after the third step S3 or at the same time as the third step S3 is performed. As yet another example, embodiments of the process can include installation of a nozzle maintenance detector 9 and/or upgrading of software of the controller 2 to provide maintenance check functionality or maintenance check features.

The automatic nozzle transceiver 7 or nozzle receiver element NRE functionality testing and maintenance actions provided by embodiments of my apparatus 1 and process can help avoid situations where a nozzle has a broken element or improperly working element that affects an end user experience at a dispenser 3 of a fueling station or recharging station. Embodiments can permit a station operator to proactively resolve nozzle transceiver issues as soon as they arise (or within a relatively short period of time after they arise) to avoid such problems and improve end user experiences at the station. Also, embodiments can permit a station operator to better understand the status of the operator's dispenser equipment and perform more proactive preventive maintenance to resolve issues so that dispenser availability is maximized as much as possible for a station operator. Embodiments can be configured so that such improvements can be provided without requiring significant increases in operational costs to perform the nozzle transceiver 7 status monitoring as well.

It should be appreciated that other modifications to the embodiments explicitly shown and discussed herein can be made to meet a particular set of design objectives or a particular set of design criteria. For instance, the type of computer device 21 can be any of a number of suitable devices. As another example, the dispenser controller CPU can be a controller, a computer, a logic controller, or other type of device that has sufficient hardware and software for communicating with the nozzle transceiver and dispenser transceiver for testing the nozzle transceiver and evaluating the results of the testing. The dispenser controller 2 can be a controller of the dispenser 3 that also handles various other tasks of the dispenser 3 or can be a controller that is specifically provided for controlling operations of the nozzle transceiver maintenance detection via nozzle maintenance detector 9.

As yet another example, it should be appreciated that embodiments can be configured for testing of at least one nozzle receiver element NRE of the nozzle 5, at least one nozzle transmitter element NTE of the nozzle 5 as well as at least one nozzle receiver element NRE of the nozzle 5, or can be configured for testing of at least one nozzle transceiver 7, which can include at least one nozzle receiver element NRE and at least one nozzle transmitter element NTE. The testing can also include testing of the nozzle maintenance detector 9 or its related components (e.g. its receiver element, etc.).

As yet another example, it should be apparent that the dispenser 3 can be a dispenser for hydrogen fuel, natural gas fuel, or other type of fuel. The dispenser 3 can also be a dispenser for recharging of an electric vehicle battery (e.g. a recharging station dispenser). The vehicles that can be supplied with fuel or recharging via the nozzle 5 of the dispenser 3 can be a car, truck, bus, boat, or other type of vehicle.

As another example, it is contemplated that a particular feature described, either individually or as part of an embodiment, can be combined with other individually described features, or parts of other embodiments. The elements and acts of the various embodiments described herein can therefore be combined to provide further embodiments. Thus, while certain exemplary embodiments of apparatuses for hydrogen dispensing, processes for maintenance for nozzle elements of a fuel dispenser or charger of a recharging station, a nozzle maintenance apparatus (e.g. fuel dispenser nozzle maintenance apparatus or vehicle recharging nozzle maintenance apparatus, etc.), and methods of making and using the same have been shown and described above, it is to be distinctly understood that the invention is not limited thereto but may be otherwise variously embodied and practiced within the scope of the following claims.

What is claimed is:

1. An apparatus for nozzle maintenance of a nozzle, comprising: a nozzle maintenance detector positionable at a dispenser to communicate with a nozzle receiver element of a nozzle when the nozzle is in a stowed position of the nozzle; and the nozzle maintenance detector configured such that a test signal from a controller is transmittable to the nozzle receiver element when the nozzle is in the stowed position; and a test signal response to the test signal sent to the nozzle receiver element is receivable at the controller to evaluate the test signal response to determine whether to trigger initiation of at least one maintenance activity; wherein the nozzle is a nozzle of a hydrogen fuel dispenser or natural gas dispenser or an electric vehicle recharging station dispenser; wherein the at least one maintenance activity includes at least one of: automatic initiation of a nozzle receiver element cleaning operation; automatic cycling of power to the nozzle receiver element to restart the nozzle receiver element; and/or automatic cycling of power to the dispenser to restart the controller or a controller of the dispenser.

2. The apparatus of claim 1, wherein: the at least one maintenance activity includes:
   performance of a first maintenance activity comprising automatic cycling of power to the nozzle receiver element to restart the nozzle receiver element; and/or
   performance of a second maintenance activity comprising automatic cycling of power to the dispenser to restart the controller or a controller of the dispenser.

3. The apparatus of claim 2, wherein the at least one maintenance activity also includes:
   performance of a third maintenance activity comprising automatic sending of at least one communication to a user communication device to initiate scheduling of repair or replacement of the nozzle receiver element.

4. The apparatus of claim 1, wherein the nozzle maintenance detector is configured such that the test signal from the controller is transmittable to the nozzle receiver element at a pre-defined maintenance check time period, wherein the pre-defined maintenance check time period is 1 second, 30 seconds, 1 minute, 30 minutes, 45 minutes, 1 hour, or 2 hours.

5. The apparatus of claim 1, wherein the nozzle maintenance detector is also configured such that a test signal from a controller is transmittable to a receiver element of the nozzle maintenance detector when the nozzle is in the stowed position and a test signal response to the test signal sent to the nozzle maintenance detector is receivable at the controller to evaluate the test signal response to determine whether to trigger initiation of the at least one maintenance activity.

6. The apparatus of claim 1, wherein the controller is a controller of the dispenser that is communicatively connected to the nozzle maintenance detector.

7. The apparatus of claim 6, comprising:
the dispenser;
the controller; and
the nozzle, the nozzle being connected to the dispenser via a flexible hose.

8. A process for nozzle maintenance comprising: detecting use of a nozzle of a dispenser for fueling or recharging has ended; testing a nozzle receiver element of the nozzle to verify functionality of the receiver element after a pre-defined maintenance check time period has elapsed after the detecting of the use of the nozzle has ended; and in response to detection of an error from the testing of the nozzle receiver element, automatically initiating at least one maintenance activity; wherein the dispenser is a dispenser for hydrogen fueling or natural gas fueling; wherein the at least one maintenance activity comprises: automatic initiation of a cleaning operation; automatic cycling of power to the nozzle receiver element to restart the nozzle receiver element; and/or automatic cycling of power to the dispenser to restart a controller of the dispenser.

9. The process of claim 8, wherein: the initiating of the at least one maintenance activity includes:
performance of a first maintenance activity comprising automatic cycling of power to the nozzle receiver element to restart the nozzle receiver element; and/or
performance of a second maintenance activity comprising automatic cycling of power to the dispenser to restart the controller or a controller of the dispenser.

10. The process of claim 9 wherein the initiating of the at least one maintenance activity also includes:
performance of a third maintenance activity comprising automatic sending of at least one communication to a user communication device to initiate scheduling of repair or replacement of the nozzle receiver element.

11. The process of claim 10, wherein the performance of the third maintenance activity occurs after the performance of the first maintenance activity occurs and/or the performance of the third maintenance activity occurs after the performance of the second maintenance activity occurs.

12. The process of claim 9, wherein the performance of the second maintenance activity occurs after the performance of the first maintenance activity occurs.

13. The process of claim 8, wherein the pre-defined maintenance check time period is 1 second, 30 seconds, 1 minute, 30 minutes, 45 minutes, 1 hour, or 2 hours.

14. The process of claim 8, wherein the testing of the nozzle receiver element of the nozzle to verify functionality of the receiver element comprises:
sending a test signal to the nozzle receiver element; and
comparing a test signal response received from a nozzle transmitter element of the nozzle with the test signal to determine whether at least one field of data of the test signal matches at least one corresponding field of data of the test signal response.

15. The process of claim 14, where the at least one field of data of the test signal comprises a software version field and/or a protocol identification field and the at least one corresponding field of data of the test signal response comprises a software version field and/or a protocol identification field.

16. The process of claim 14, comprising:
sending a test signal to a receiver element of a nozzle maintenance detector; and
comparing a test signal response received from a transmitter element of the nozzle maintenance detector with the test signal to determine whether at least one field of data of the test signal matches at least one corresponding field of data of the test signal response received from a transmitter element of the nozzle maintenance detector.

* * * * *